United States Patent
Hsieh et al.

(10) Patent No.: US 8,466,376 B2
(45) Date of Patent: Jun. 18, 2013

(54) ENCLOSURE OF ELECTRONIC DEVICE

(75) Inventors: Po-Chuan Hsieh, Taipei Hsien (TW);
Yu-Chang Pai, Taipei Hsien (TW);
Chien-Hung Liu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 317 days.

(21) Appl. No.: 12/868,687

(22) Filed: Aug. 25, 2010

(65) Prior Publication Data

US 2011/0297438 A1 Dec. 8, 2011

(30) Foreign Application Priority Data

Jun. 7, 2010 (TW) .................................. 99118302

(51) Int. Cl.
*H05K 7/20* (2006.01)
(52) U.S. Cl.
USPC ............................ 174/547; 174/383; 454/184
(58) Field of Classification Search
USPC .................... 174/383, 547; 454/184; 361/693
See application file for complete search history.

(56) References Cited

U.S. PATENT DOCUMENTS

| | | | | |
|---|---|---|---|---|
| 5,744,213 | A | * | 4/1998 | Nelson ........................ 428/131 |
| 5,928,076 | A | * | 7/1999 | Clements et al. ............ 454/184 |
| 6,002,584 | A | * | 12/1999 | Messmer et al. ............. 361/690 |
| 6,947,294 | B2 | * | 9/2005 | Lin et al. ...................... 361/818 |
| 7,173,822 | B2 | * | 2/2007 | Liang et al. .................. 361/695 |
| 7,199,310 | B2 | * | 4/2007 | Cochrane ..................... 174/383 |
| 7,492,610 | B2 | * | 2/2009 | Gilliland ...................... 361/818 |
| 2006/0196692 | A1 | * | 9/2006 | Sakamoto et al. ........... 174/383 |
| 2007/0272438 | A1 | * | 11/2007 | Gilliland et al. ............. 174/383 |

* cited by examiner

*Primary Examiner* — Hung Ngo
(74) *Attorney, Agent, or Firm* — Altis Law Group, Inc.

(57) ABSTRACT

An enclosure of an electronic device includes a ventilation plate. The ventilation plate is a grid including a number of crisscrossed connection bars and a number of through holes defined by the connection bars. A tab is formed at each of the connection bars bounding each of the through holes. The tabs are substantially angled from a plane of the grid to elongate a path electromagnetic signals must travel to pass through the ventilation plate. The enclosure with the shields can shield the electronic device from EMI.

6 Claims, 5 Drawing Sheets

ENCLOSURE OF ELECTRONIC DEVICE

CROSS-REFERENCE TO RELATED APPLICATIONS

Relevant subject matter is disclosed in the co-pending U.S. patent applications (application Ser. Nos. 12/841,125, 12/849,939, 12/855,903, 12/859,283, 12/860,941, 12/869,709, having the same title, which are assigned to the same assignee as named herein.

BACKGROUND

1. Technical Field

The present disclosure relates to an enclosure of an electronic device.

2. Description of Related Art

For the enclosure of a typical electronic device, electromagnetic interference (EMI) is a common problem during operation. Commonly, through holes are defined in the enclosure for aiding in heat dissipation, and though sizes and placement of the holes are chosen and arranged to help avoid EMI, problems from EMI still occur.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
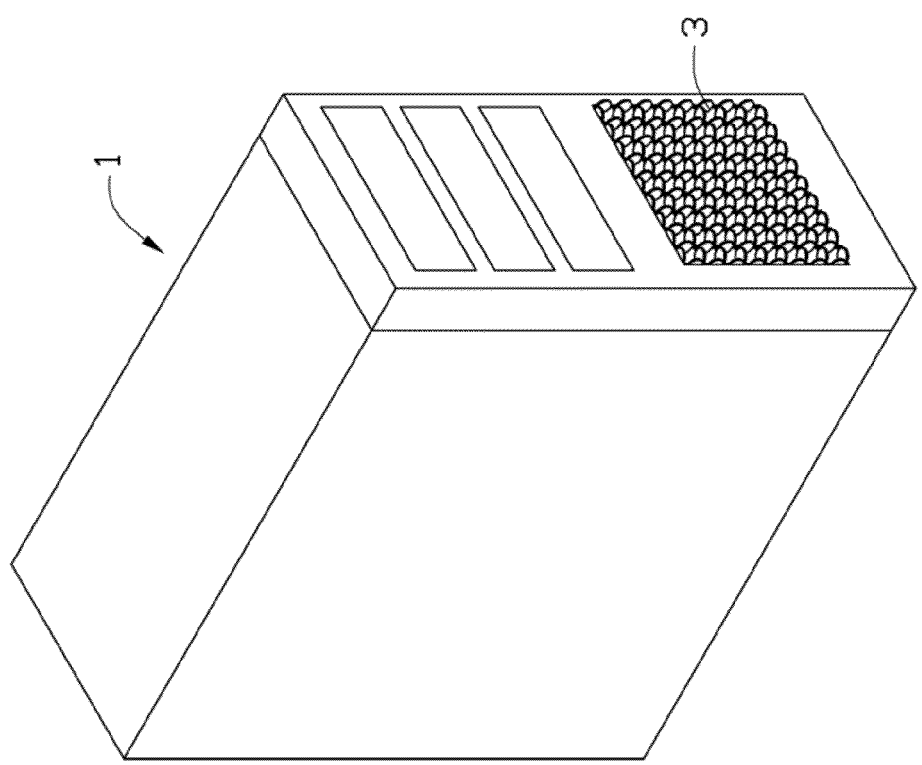
FIG. 1 is an isometric view of an exemplary embodiment of an enclosure of an electronic device.
Figure 2:
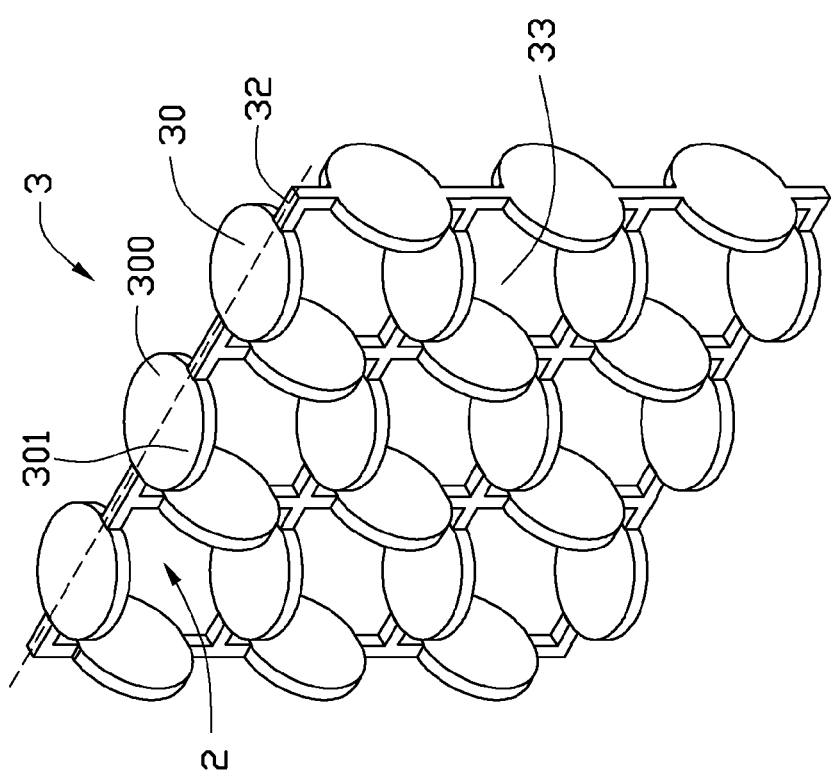
FIG. 2 is an isometric view of a plate in the enclosure of FIG. 1.
Figure 3:
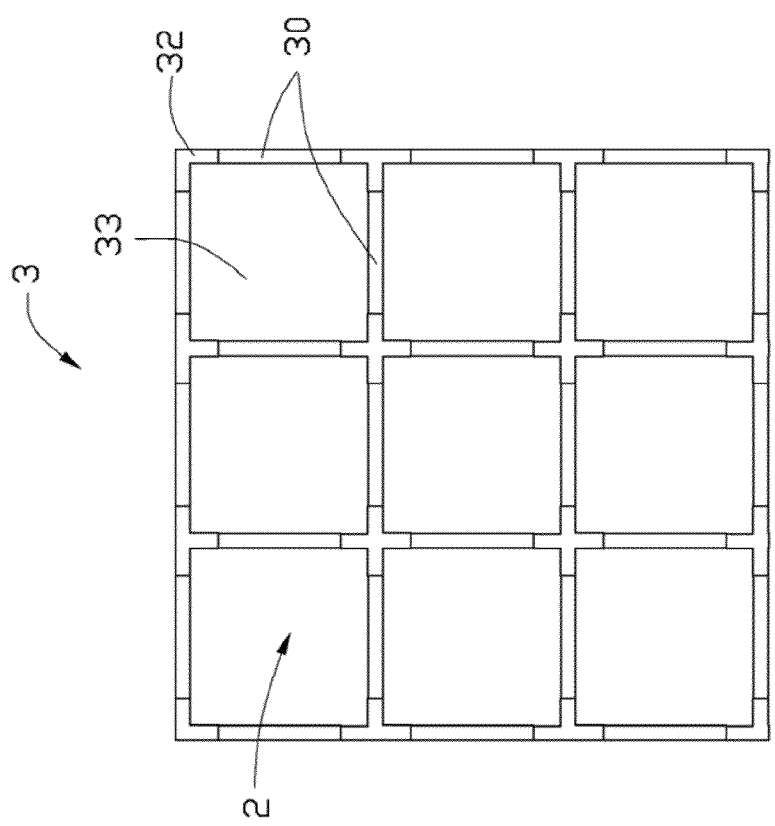
FIG. 3 is a front plan view of the plate of FIG. 2.
Figure 4:
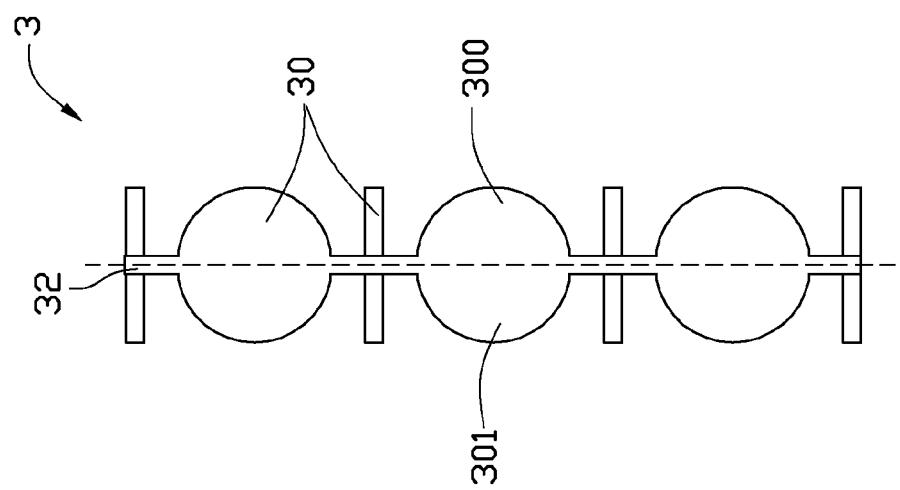
FIG. 4 is a side view of the plate of FIG. 2.

The disclosure, including the accompanying drawings, is illustrated by way of example and not by way of limitation. It should be noted that references to "an" or "one" embodiment in this disclosure are not necessarily to the same embodiment, and such references mean at least one.

Referring to FIGS. 1 to 4, an exemplary embodiment of an enclosure 1 of an electronic device includes a ventilation plate 3. The ventilation plate 3 can be attached to a panel of the enclosure 1 for ventilation.

The ventilation plate 3 includes a plurality of tabs 30 and a plurality of crisscrossed connection bars 32. Each tab 30 is round shaped, and extending through the center of the corresponding, connection bar 32. Each tab 30 includes two parts 300 and 301. The two parts 300 and 301 of a tab respectively protrude out from two opposite sides of the ventilation plate 3. A plurality of through holes 33 are defined by the connection bars 32. A tab 30 is formed at each of the connection bars 32 bounding, each one of the through holes 33. The tabs 30 are substantially perpendicular to the panel of a grid 2 formed by the connection bars 32 to elongate a path electromagnetic signals must travel to pass through the ventilation plate 3. In the embodiment, every two adjacent tabs 30 bounding a through hole 33 are perpendicular to each other, and every two opposite tabs in a hole are parallel with each other. In other embodiments, the tabs 30 may he set at other angles, such as 30 degrees. In other words, the tabs 30 are substantially angled from the plane of the grid 2.

In other words, the plate 3 defines the plurality of through holes 33. Each through hole 33 is bounded by four tabs 30 which are located on different planes, and connecting bars 32. The four tabs 30 are round and connected together by the connecting bars 32, and perpendicular to the plate 3. As a result, heat inside the enclosure can be vented to the outside through the through holes 3.

Figure 5:
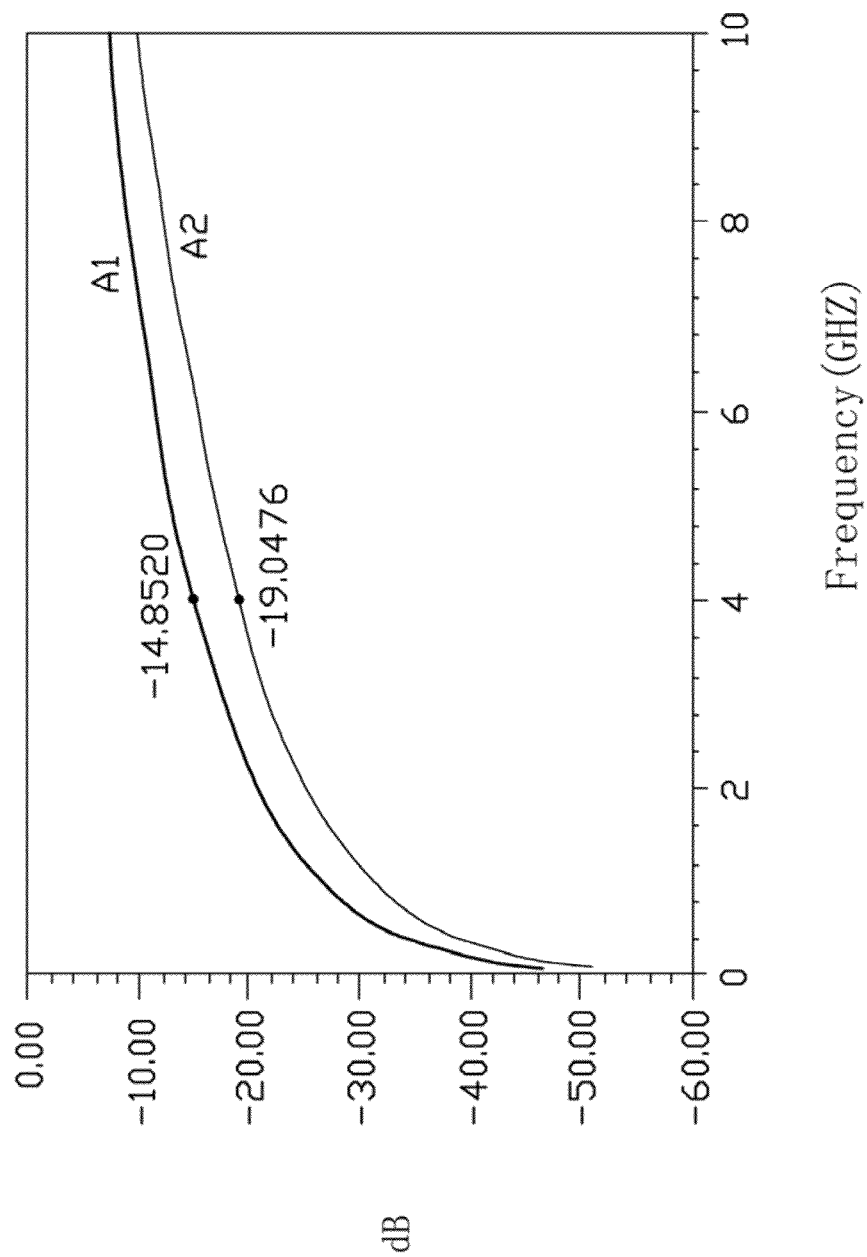
FIG. 5 is a graph showing EMI shielding effectiveness of a conventional enclosure and the enclosure of FIG. 1.

Referring to FIG. 5, a curve A1 represents EMI shielding effectiveness of a conventional enclosure. A curve A2 represents EMI shielding effectiveness of the enclosure 1 with the plate 3 of FIG. 1. FIG. 5 clearly indicates that the EMI shielding effectiveness of the enclosure 1 with the plate 3 is better than the EMI shielding effectiveness of the conventional enclosure.

Furthermore, in other embodiments, the size and shape of the tabs 30 and the connection bars 32 can be changed according to need. When the tabs 4 are configured with a different size and a different shape, the EMI shielding effectiveness of the enclosure 1 may be different.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An enclosure of an electronic device, the enclosure comprising a ventilation plate, wherein the ventilation plate is a grid comprising a plurality of crisscrossed connection bars and a plurality of through holes defined by the connection bars; a tab is formed at each of the connection bars bounding each of the through holes; the tabs are substantially angled from a plane of the grid to elongate a path electromagnetic travels along; wherein each tab is divided by the corresponding connection bar into two parts, one of which extends from a side of the late in a first direction, and the other one of which extends from an opposite side of the plate in a second direction opposite to the first direction.

2. The enclosure of claim 1, wherein each of the tabs is round shaped with the corresponding connection bar extending through the center thereof.

3. The enclosure claim 1, wherein every two adjacent tabs bounding each of the through holes are perpendicular to each other, and every two opposite tabs bounding each of the through holes are parallel with each other.

4. An enclosure of an electronic device, the enclosure comprising a plate, wherein the plate defines a plurality of through holes, each of the through holes is bounded by four tabs located on different planes; each tab comprises two parts, the two parts of a tab respectively protrude out from two opposite sides of the plate.

5. The enclosure of claim 4, wherein each tab is round shaped.

6. The enclosure of claim 4, wherein every two adjacent tabs bounding each of the through holes are perpendicular to each other, and every two opposite tabs in each of the through holes are parallel with each other.

* * * * *